United States Patent [19]

Becker et al.

[11] Patent Number: 5,453,696

[45] Date of Patent: Sep. 26, 1995

[54] EMBEDDED FUSE RESISTANCE MEASURING CIRCUIT

[75] Inventors: William R. Becker, Los Gatos; Michael G. Ahrens, Sunnyvale, both of Calif.

[73] Assignee: Crosspoint Solutions, Inc., Santa Clara, Calif.

[21] Appl. No.: 189,950

[22] Filed: Feb. 1, 1994

[51] Int. Cl.[6] .......................... G01R 31/02; H01H 37/76
[52] U.S. Cl. .................. 324/550; 327/525; 324/713
[58] Field of Search ..................... 324/550, 713, 324/715, 719, 158 R, 158 T; 307/465, 202.1; 327/525

[56] References Cited

U.S. PATENT DOCUMENTS

| | | | |
|---|---|---|---|
| 4,873,459 | 10/1989 | El Gamal et al. | 367/465 |
| 5,194,759 | 3/1993 | El-Ayat et al. | 307/468 |
| 5,243,226 | 9/1993 | Chan | 307/465 |
| 5,272,388 | 12/1993 | Bakker | 365/96 |
| 5,293,133 | 3/1994 | Birkner et al. | 324/713 |
| 5,294,846 | 3/1994 | Paivinen | 307/465 |
| 5,299,150 | 3/1994 | Galbraith et al. | 365/94 |
| 5,302,546 | 4/1994 | Gordon et al. | 437/170 |
| 5,304,871 | 4/1994 | Dharmarajan | 307/443 |

*Primary Examiner*—Maura K. Regan
*Attorney, Agent, or Firm*—Townsend and Townsend Khourie and Crew

[57] ABSTRACT

The present invention provides for an embedded test circuit in an integrated circuit. The integrated circuit has a plurality of conducting line segments and fuse elements therebetween with each fuse element selectively connectable in series through the crossing line segments and programming circuits between a pair of programming terminals. Each fuse element is also associated with a pair of test lines with each test line connected to one of the line segments having the fuse element between the test lines. Each test line pair is selectively connectable to a pair of test terminals. The resistance of a selected fuse element is measured by selectively passing a current between the first and second programming terminals through the selected fuse element and selectively measuring a voltage drop across the selected fuse element through the pair of test terminals.

7 Claims, 3 Drawing Sheets

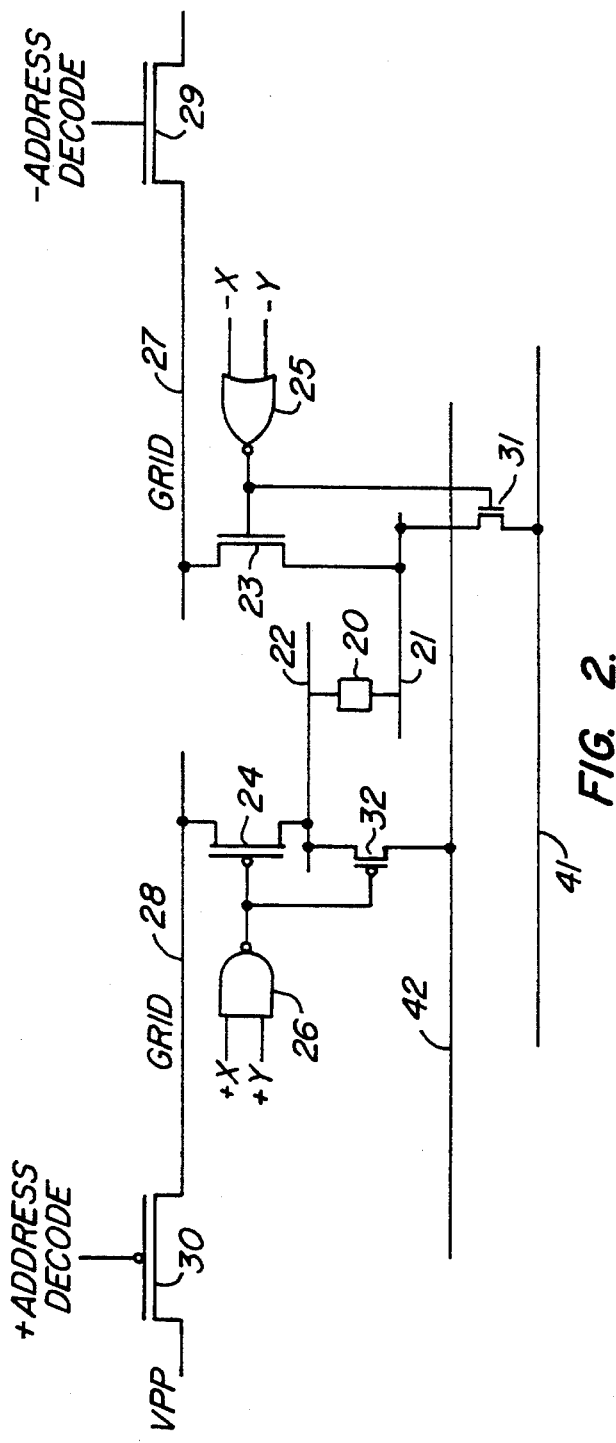
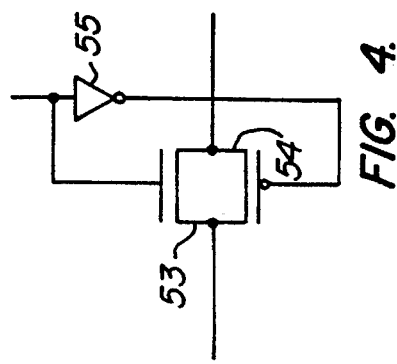
FIG. 2.
FIG. 4.

EMBEDDED FUSE RESISTANCE MEASURING CIRCUIT

BACKGROUND OF THE INVENTION

The present invention is related to the testing of integrated circuits and, more particularly, to measurement circuits of fuse elements in integrated circuits.

One type of fuse element is the antifuse, which is found in a growing number of integrated circuits, most of which are field programmable gate arrays (FPGAs). Antifuses have a very high resistance (to form essentially an open circuit) in the unprogrammed ("off") state, and a very low resistance (to form essentially a closed circuit) in the programmed ("on") state. In these integrated circuits antifuses are placed at the crossing points of interconnection lines which lead to different elements of the integrated circuit. By programming selected antifuses, the interconnections between the various elements of the integrated circuit are formed to define the function of the device.

To program these antifuses, a large voltage is placed across the selected antifuse. In the antifuse a nominally nonconducting programming layer, where two conducting lines cross, is melted to create a connection between the two conducting lines. The resistance of the unprogrammed antifuse, greater than 1 MegOhm, drops to tens of ohms, when programmed.

The description above is ideal. Problems may occur when the resistance of the programmed antifuse is not as low as desired. However, since the typical FPGA typically has hundreds of thousands of antifuses, it is difficult to locate a particular antifuse, and, once located, to test the antifuse.

The present invention solves or substantially mitigates these problems with test circuitry which is embedded in the integrated circuit to measure the resistance of a selected antifuse. In accordance with the present invention, the test circuitry is implemented in the integrated circuit with a minimum of overhead.

SUMMARY OF THE INVENTION

The present invention provides for an embedded test circuit in an integrated circuit. The integrated circuit has a plurality of conducting line segments and fuse elements therebetween with each fuse element selectively connected in series through the crossing line segments between a pair of programming terminals. Each fuse element is associated with a pair of test lines with each test line connected to one of the line segments having the fuse element between the two line segments. Each test line pair is selectively connected to a pair of test terminals. The resistance of a selected fuse element is measured by selectively passing a current between the first and second programming terminals through the selected fuse element and selectively measuring a voltage drop across the selected fuse element through the pair of test terminals. The testing may be performed as the fuse element is programmed, or after programming is completed.

BRIEF DESCRIPTION OF THE DRAWINGS

A more detailed understanding of the present invention may be achieved by perusing the following Detailed Description Of Preferred Embodiments of the present invention with reference to the following drawings:

FIG. 2 is a detail of the test transistors and circuits with the wiring segments and the programming transistors to program an antifuse in a row in the core array of the FPGA in FIG. 1 in accordance with an embodiment of the present invention;

FIG. 4 is a circuit diagram of a transfer gate shown in FIG. 3.

DETAILED DESCRIPTION OF PREFERRED EMBODIMENTS

Figure 1:
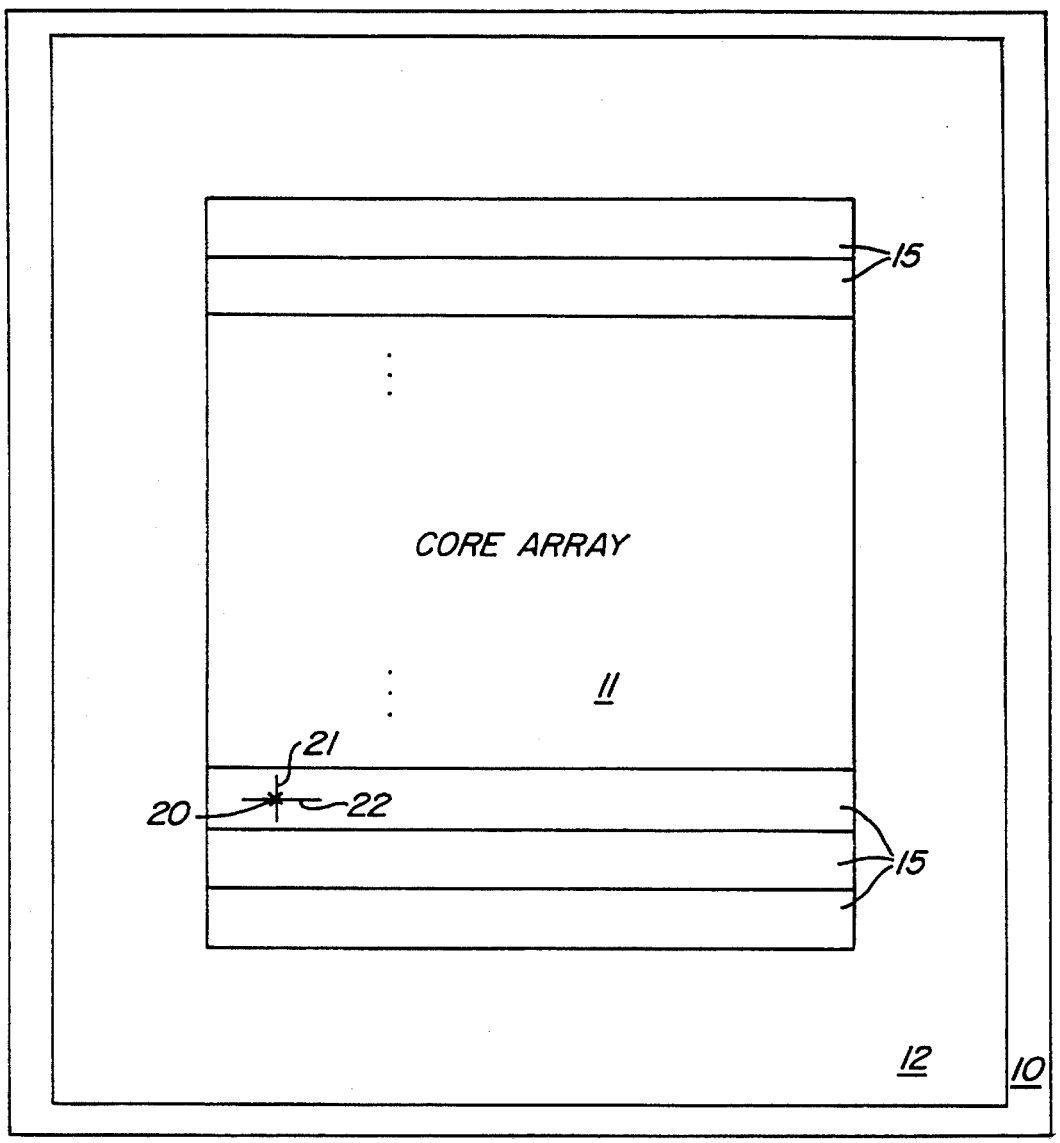
FIG. 1 illustrates the general organization of an FPGA integrated circuit.

FIG. 1, a top view of an field programmable gate array (FPGA) integrated circuit, shows a general organizational layout of an FPGA. On a semiconductor substrate 10 the FPGA has a central core array 11, which can contain logic block elements, routing interconnections, and transistors, which may be interconnected by programmed antifuses for the user's application. Surrounding the core array 11 is a peripheral section 12, which contains the circuits for programming the antifuses in the core array 11, the control circuitry used for addressing the wiring segments in programming the selected antifuses, and the input/output circuitry for receiving signals from the outside world into the FPGA interior and for driving signals from the interior of the FPGA to the outside world.

The core array 11 is organized into repetitive rows 15 of the logic block elements, routing interconnections, and transistors, and along each row 15 the logic block elements, routing interconnections, and transistors are also organized into repetitive patterns. In FIG. 1 only five of the rows 15 are symbolically shown. Exemplary crossing line segments 21 and 22 are shown with an antifuse 20 connected therebetween. It should be understood that the entire core array 11 is organized into the rows 15.

Antifuses are placed where wiring segments cross in the rows 15. To connect two crossing wiring segments, the two wiring segments must be simultaneously and independently addressed. One wiring segment is driven to a high programming voltage, $V_{pp}$, and the other wiring segment is driven to a low programming voltage, $V_{pn}$. The difference between the two programming voltages across the antifuse at the intersection of the two segments programs the antifuse. As explained below, these programming voltages, $V_{pp}$ and $V_{pn}$, are generated from programming pins connected to particular bonding pads during programming. This allows flexibility with respect to the particular programming voltages, but is not a requirement for the antifuse testing procedure according to the present invention. For example, $V_{pn}$ could be set to ground, rather to the voltage of the $V_{pn}$ programming pin.

FIG. 2 illustrates antifuse 20 between crossing wiring segments 22 and 21. In general, every wiring segment in the core array 11 is connected to large transistors for programming purposes. In the embodiment described, each wiring segment 22 or 21 is connected to a PMOS programming transistor 24 or a NMOS programming transistor 23. The PMOS programming transistor 24, connected to a + address circuit, drives the wiring segment to $V_{pp}$ during programming and the NMOS programming transistor 23, connected to a − address circuit, drives the segment to $V_{pn}$ during programming.

The +, or $V_{pp}$, address circuit, and the −, or $V_{pn}$, address circuit are two independent circuits for programming. Through the + address circuit and PMOS programming transistor 24, a + addressed wiring segment can be driven to $V_{pp}$ and is connected ultimately to a $V_{pp}$ pin (at +10 volts) of the FPGA integrated circuit during programming; through the − address circuit and NMOS programming transistor 23, the − addressed wiring segment can be driven to $V_{pn}$ and is connected ultimately to a $V_{pn}$ pin of the FPGA during programming.

As shown in FIG. 2, each of the + and − programming address circuits are separated into two parts. One part of the programming address circuits decodes address signals down to a bank of programming transistors connected to the wiring segments in a repetitive group of segments in a row 15. Thus these address signals, represented by +X, +Y for the + address circuit and −X, −Y for the − address circuit, select a number of PMOS programming transistors 24 (and their associated wiring segments 22) for the $V_{pp}$ programming voltage and NMOS programming transistors 23 (and their wiring segments 21) for the $V_{pn}$ programming voltage. The selection of the particular PMOS programming transistor 24 of the number selected by the +X, +Y address signals and NMOS programming transistor 23 of the number selected by the −X, −Y address signals is performed by connecting only one of the PMOS programming transistors 24 to $V_{pp}$ and only one of the NMOS transistors 23 to $V_{pn}$.

Each wiring segment 22 and 21 is connected to a PMOS programming transistor 24 and a NMOS programming transistor 23 respectively. The + and − address decoding occurs on both the sources and gates of the programming transistors 24 and 23. The +X, +Y address signals are decoded for the gates of the PMOS programming transistors 24; this gate decoding function is represented by a NAND gate 26. The −X, −Y address signals are decoded for the gates of the NMOS programming transistors 23; this gate decoding function is represented by a NOR gate 25. For the + and − address decoding on the sources of the programming transistors, the source node of each PMOS programming transistor 24 is connected to one of a number of $V_{pp}$ voltage supplies in the form of + programming grids. Likewise, the source node of the NMOS programming transistor 23 is connected to one of a number of $V_{pn}$ voltage supplies also in the form of − programming grids.

Each programming grid is formed from metal lines which run horizontally in every row 15. Each grid is regularly cross-connected vertically. Grids are used, rather than only horizontal lines, to minimize the effective metal resistance between the source node of any programming transistor 24, 23 and the edge of the array 11 where the grids are connected to the $V_{pp}$ and $V_{pn}$ programming voltages. In this manner sufficient power can be delivered to any antifuse in the array 11 to program the antifuse.

The programming grids are not connected directly to the $V_{pn}$ and $V_{pn}$ power pins on the integrated circuit. Between the grids and the pins are many large transistors distributed around the periphery of the array 11. These peripheral programming transistors, represented by transistors 30 and 29 in FIG. 2, are connected such that during the programming of an antifuse, represented by the antifuse 20 in FIG. 2, only one + programming grid is connected to the $V_{pp}$ pin and only one − programming grid is connected to the $V_{pn}$ pin.

The remaining programming grids are at an intermediate voltage $V_{pr}$, approximately +5 volts, which is obtained by a precharge operation prior to the programming of the selected antifuse. In the precharge operation, all of the + and − programming grids are set to +5 volts and all of the programming transistors are turned on and then turned off. Except for the isolation of elements in the CST rows 15 discussed below, all of the wiring segments are then left floating at +5 volts.

Further details of a particular FPGA programming circuitry is found in a U.S. Patent entitled, "A FIELD PROGRAMMABLE GATE ARRAY," U.S. Pat. No. 5,313,119 Laurence H. Cooke and David Marple, and assigned to the present assignee. But in all of FPGAs some form of decoding circuits is used to address the particular wiring segments to program the targeted antifuse.

The present invention takes advantage of these programming circuits. Associated with each programming transistor is a test transistor having the same polarity as the programming transistor. In FIG. 2 a PMOS test transistor 32 is associated with the PMOS programming transistor 24 and a NMOS test transistor 31 is associated with the NMOS programming transistor 23. Each test transistor 32, 31 has one source/drain connected to the same wiring segment 22, 21 as connected to the programming transistor 24, 23 respectively. The gate electrode of the test transistor 32, is connected to the gate electrode of the programming transistor 24, 23. Thus if the programming transistor 24, 23 is addressed, the associated test transistor 32, 31 is also addressed. The remaining source/drain of each test transistor 32, 31 is connected to a test line 42, 41 respectively.

The test transistors are very small, i.e., they have minimum width, since the test transistors 32, 31 are not required to carry any DC currents. In contrast, the programming transistors must carry heavy DC or AC currents to program the antifuses in the core array 11. For example, in one process technology a test transistor occupies approximately 2.5 μm$^2$ and a programming transistor occupies 60 μm$^2$. Thus the test transistors occupy comparatively little space.

Figure 3:
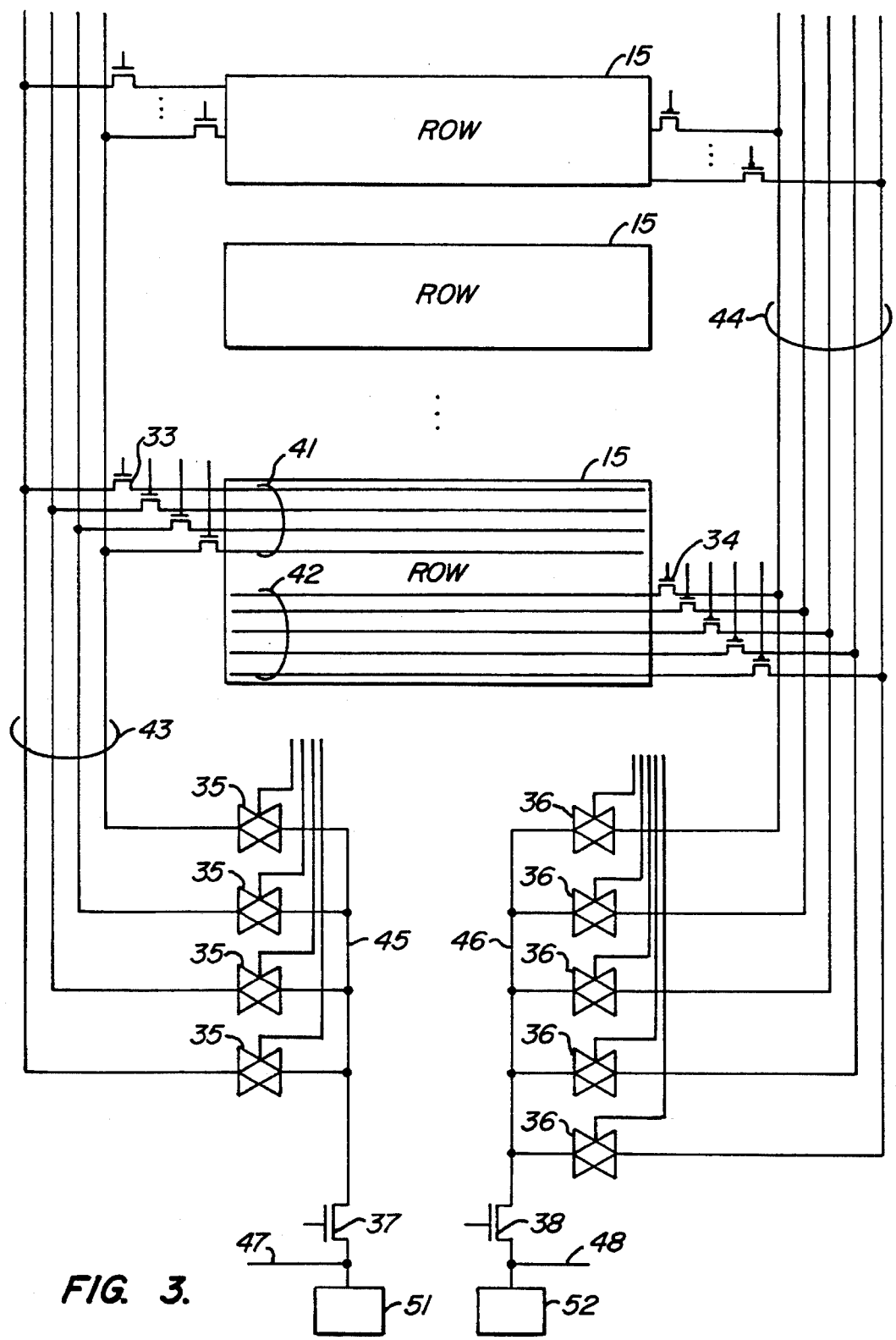
FIG. 3 illustrates the organization of the test circuits connected to the test transistors in the core array of the FPGA of FIG. 2.

In the embodiment shown in FIG. 3, each row in the core array 11 has five test lines 42 from the PMOS test transistors 32 and four test lines 41 from the NMOS test transistors 31. On each side of the core array 11 is a set of peripheral test lines 73 and 74. Five PMOS peripheral test lines 44 run along the right side of the core array 11 and each PMOS test line 42 of each row 15 is connected to one of the PMOS peripheral test lines 44 through a PMOS pass transistor 34. Likewise, four NMOS peripheral test lines 43 run along the left side of the core array 11 and each NMOS test line 41 of each row 15 is connected to one of the NMOS peripheral test lines 43 through a NMOS pass transistor 33.

Each of the PMOS peripheral test lines 44 is connected by a peripheral transfer gate 36 to a single PMOS test output line 46. The PMOS test output line 46 is, in turn, connected to a bonding pad 52 through a NMOS test mode transistor 38. Likewise, each of the NMOS peripheral test lines 43 is connected by a peripheral transfer gate 35 to a single NMOS test output line 45.

The NMOS test output line 75 is connected to a bonding pad 51 through a NMOS test mode transistor 37. To permit the bonding pads 52 and 51 to be used for more than one purpose, other circuits in the integrated circuit are connected to the bonding pads 52 and 51, as indicated in FIG. 3. During the testing of the antifuses, the test mode transistors 38 and 37 are turned on to connect the bonding pads 52 and 51 to the test circuitry described above. Otherwise, the pads 52 and 51 remain coupled to the other circuits, such as clock circuits, for example, by connection lines 48 and 47.

The circuit diagram of one of the transfer gates 36 and 35 is shown in FIG. 4. A single transistor might serve as a transfer gate where all the transistors in the test path are of the same polarity. Thus a single NMOS transistor may serve as one of the transfer gates 35, since all the other transistors 31, 33, and 37 from the line segment 41 to the pad 51 are NMOS transistors. Similarly, a single PMOS transistor could serve as one of the transfer gates 36 but for the NMOS test mode transistor 38. The NMOS\PMOS circuit shown in FIG. 4 operates equally well whether all the transistors in the test path are of the same polarity or not.

Each of the transfer gates 36 and 35 has a PMOS transistor 54 and NMOS transistor 53 connected in parallel so that the source/drains of each of the transistors form part of the test path. Hence the source/drains of the PMOS and NMOS transistor 54 and 53 of a transfer gate 36 are respectively connected to a peripheral test line 44 and to the test output line 46. Similarly the source/drains of the PMOS and NMOS transistor 54 and 53 of a transfer gate 35 are respectively connected to a peripheral test line 43 and to the test output line 45. The gate electrodes of both transistors 54 and 53 are connected to the test address decoding circuits discussed immediately below. An inverter 55 shown in FIG. 4 indicates that the gate electrodes of both transistors 54 and 55 are connected to the test address decoding circuits in such a manner that both transistors are turned on at the same time. This may be done by connecting the gate electrodes of the transistors 54 and 53 to different nodes of the test address decoding circuits having opposite logic states at the same time, or using an inverter to invert the signal to one of the transistors 54 and 53.

Referring back to FIG. 3, PMOS test address decoding circuits are connected to each of the gate electrodes of the PMOS test transistors 34, transfer gates 36, and test mode transistors 38, and NMOS test address decoding circuits are connected to the gate electrodes of the NMOS test transistors 33, transfer gates 35, and test mode transistors 37. Together with the programming address decoding circuits for the test transistors 32 and 31, the test address decoding circuits select the particular wiring segments 22 and 21 for connection to the bonding pads 52 and 51. It should be noted that most of the decoding circuits for testing the antifuses of the FPGA reside in the programing decoding circuits, which are required to address each of the programming transistors 24 and 23 for the thousands of wiring segments in the core array 11. The test transistors 34 and 33, transfer gates 36 and 35, and test mode transistors 38 and 37 form only a fraction of the number of the programming transistors 24 and 23. Thus the added test circuits do not occupy as much space on, nor add as much complexity to, the integrated circuit as one might presume.

Of course, the design of decoding circuits for addressing functions are well known to integrated circuit designers. Note that the address signals for the decoding circuits may be transmitted in parallel through the multiple input pins of the integrated circuit. Alternatively, the signal addresses may serially scanned into the integrated circuit as suggested by the IEEE 1149.1 testing procedure. A particular testing procedure by serial scanning is described in U.S. Pat. No. 5,347,319 by Laurence H. Cooke et al. and assigned to the present assignee.

In operation, the present invention operates as follows. When an antifuse 20 is programmed, the programming transistors 24 and 23 of the crossing wiring segments 22 and 21 are turned on to program the selected antifuse 20. The programming address decoders also connect the selected programming transistors to one of two programming pins at one of the programming voltages, $V_{pp}$ or $V_{pn}$. Thus the selected antifuse is subjected to a large programming voltage, $V_{pp}-V_{pn}$, with heavy programming currents.

For testing the selected antifuse, the programming pins are returned to standard operating voltages, such as +5 and 0 volts. The programming transistors 24 and 23 remain on so that the test transistors 32 and 31 associated with the programming transistors 24 and 23 are turned on also. Additionally, the test address signals which are used to identify the particular antifuse to be tested are used by test decoding circuits, PMOS and NMOS, to selectively connect the test transistors 32 and 31 to the pins connected to the bonding pads 52 and 51.

This permits a simple Kelvin test of the programmed antifuse 20. With a current through the selected antifuse 20, there is a voltage drop across the antifuse, which is monitored through the bonding pads 52 and 51 operating in test mode. Since the current is known, easily determined by an ammeter at one of the programming pins, the voltage drop across the selected antifuse as received on the bond pads 51 and 52 yields the resistance of the antifuse directly.

Thus this embedded test circuitry, which relies upon the existing programming circuits, permits simple and accurate measurements of the resistances of the antifuses of the FPGA.

While the above is a complete description of the preferred embodiments of the invention, various alternatives, modifications and equivalents may be used. It should be evident that the present invention is equally applicable by making appropriate modifications to the embodiments described above. For example, while the present invention was described in the context of antifuses, fuses should work equally as well. Therefore, the above description should not be taken as limiting the scope of the invention which is defined by the metes and bounds of the appended claims.

What is claimed is:

1. An integrated circuit comprising a plurality of conducting line segments and fuse elements therebetween, said line segments crossing each other with said fuse elements therebetween, each fuse element selectively connected in series through said crossing line segments between a first terminal and a second terminal; and each fuse element associated with a pair of test lines, each test line selectively connected to one of said line segments having said fuse element therebetween, each test line pair selectively connected to third and fourth terminals, wherein a voltage drop across said third and fourth terminals approximates a voltage drop across said fuse element;

whereby resistance of a selected fuse element may be measured by selectively passing a current between said first and second terminals through said selected fuse element and selectively measuring a voltage drop across said selected fuse element through said third and fourth terminals.

2. The integrated circuit of claim 1 wherein each of said fuse elements comprise an antifuse.

3. The integrated circuit of claim 2 wherein said integrated circuit comprises a field programmable gate array.

4. The integrated circuit of claim 1 wherein each of said line segments is selectively connected to either said first or second terminal through a programming transistor and is selectively connected to either said third or fourth terminals through a test transistor.

5. The integrated circuit of claim 4 wherein said programming transistor and said test transistor are commonly responsive to programming address circuits.

6. The integrated circuit of claim 5 wherein said programming and test transistor have the same polarity.

7. The integrated circuit of claim 5 herein each test transistor is selectively connected to one of said third and fourth terminals through one of said test lines, responsive to test address decoding circuits.

* * * * *